(12) United States Patent
Gorshkov

(10) Patent No.: US 7,535,329 B2
(45) Date of Patent: May 19, 2009

(54) PERMANENT MAGNET STRUCTURE WITH AXIAL ACCESS FOR SPECTROSCOPY APPLICATIONS

(75) Inventor: Mikhail V. Gorshkov, Moscow (RU)

(73) Assignee: Makrochem, Ltd., Moscow (RU)

( * ) Notice: Subject to any disclaimer, the term of this patent is extended or adjusted under 35 U.S.C. 154(b) by 273 days.

(21) Appl. No.: 11/105,543

(22) Filed: Apr. 14, 2005

(65) Prior Publication Data

US 2006/0232368 A1    Oct. 19, 2006

(51) Int. Cl.
*H01F 7/02* (2006.01)
(52) U.S. Cl. .................. 335/306; 335/302; 335/296
(58) Field of Classification Search ......... 335/302–306, 335/296–299
See application file for complete search history.

(56) References Cited

U.S. PATENT DOCUMENTS

| | | | |
|---|---|---|---|
| 2,939,952 A | 6/1960 | Paul et al. | |
| 3,065,640 A | 11/1962 | Langmuir et al. | |
| 3,937,955 A | 2/1976 | Comisarow et al. | |
| 4,328,420 A | 5/1982 | French | |
| 4,535,235 A | 8/1985 | McIver, Jr. | |
| 4,540,884 A | 9/1985 | Stafford et al. | |
| 4,731,598 A * | 3/1988 | Clarke | 335/210 |
| 4,882,484 A | 11/1989 | Franzen et al. | |
| 4,963,736 A | 10/1990 | Douglas et al. | |
| 5,014,028 A * | 5/1991 | Leupold | 335/210 |
| 5,107,109 A | 4/1992 | Stafford, Jr. et al. | |
| 5,572,035 A | 11/1996 | Franzen | |
| 5,652,427 A | 7/1997 | Whitehouse et al. | |

(Continued)

FOREIGN PATENT DOCUMENTS

GB    944900    5/1962

OTHER PUBLICATIONS

Michelle v. Buchanan, Ed. Fourier Transform Mass Spectrometry: Evolution, Innovation, and Applications, American Chemical Society, ACS Symposium Series, 1987, 359, Chapter 1, pp. 1-20; Chapter 6, Fourier Transform Mass Spectrometry of Large (m/z > 5,000) Biomolecules, pp. 100-126.

(Continued)

*Primary Examiner*—Elvin G Enad
*Assistant Examiner*—Bernard Rojas
(74) *Attorney, Agent, or Firm*—Oblon, Spivak, McClelland, Maier & Neustadt, P.C.

(57) ABSTRACT

A magnet structure or instrument for spectroscopy including a plurality of magnetic flux sources disposed along a common axis. The plurality of permanent magnetic flux sources include a first magnet flux source having a first through-hole body, and include second and third magnet flux sources located respectively on opposite sides of the first magnet flux source, with at least one of the second and third magnet flux sources having a side through-hole body. Magnetic flux within the first magnet flux source is oriented to generate a first magnetic field directed along the common axis. Respective magnetic fluxes within the second and third magnet flux sources are oriented to generate second and third magnetic fields directed along the common axis, with at least one field component of either the second or third magnetic fields along the common axis inside the respective second or third magnet flux sources opposed to a direction of the first magnetic field on said common axis inside the first magnet flux source.

51 Claims, 11 Drawing Sheets

U.S. PATENT DOCUMENTS

| | | | |
|---|---|---|---|
| 5,714,755 | A | 2/1998 | Wells et al. |
| 5,965,884 | A | 10/1999 | Laiko et al. |
| 6,107,628 | A | 8/2000 | Smith et al. |
| 6,111,250 | A | 8/2000 | Thomson et al. |
| 6,403,955 | B1 | 6/2002 | Senko |
| 6,768,407 | B2 * | 7/2004 | Kohda et al. ............... 335/306 |
| 7,148,778 | B2 * | 12/2006 | Humphries et al. ......... 335/306 |
| 7,326,350 | B2 * | 2/2008 | Mueller et al. .............. 335/306 |
| 2003/0183759 | A1 | 10/2003 | Schwartz et al. |
| 2004/0211897 | A1 | 10/2004 | Kim et al. |
| 2005/0017170 | A1 | 1/2005 | Schwartz et al. |

OTHER PUBLICATIONS

Alan G. Marshall, Advances in Mass Spectrometry, vol. 11A, 1989, Analytical Capabilities and Applications of FT/ICR Mass Spectrometry, pp. 651-668.

Alan G. Marshall et al.,Int. Journal Mass Spectrometry Ion Processes, 1992 118/119, pp. 37-70.

Masamichi Yamashita et al., J. Phys. Chem, 1984, 88, Electrospray Ion Source. Another Variation on the Free-Jet Theme, pp. 4451-4459.

Koichi Tanaka et al., Protein and Polymer Analyses up to m/z 1000 000 by Laser Ionization Time-of-Flight Mass Spectrometry, pp. 1-3.

M. Karas et al., Matrix-Assisted Ultraviolet Laser Desorption of Non-Volatile Compounds, Int. Journal of Mass Spectrometry and Ion Processes, 78, 1987, 78, pp. 53-68.

A.P. Bruins, Mass Spectrometry with Ion Sources Operating at Atmospheric Pressure, Reviews 1991, 10, pp. 53-77.

R. J. Abraham et al., Introduction to NMR Spectroscopy, Introduction and Basic Principles of NMR; pp. 1-12.

J.W. Akitt, NMR and Chemistry: An Introduction to the Fourier Transform-Multinuclear Era, Modern Spectrometer Systems, 2$^{nd}$ ed., pp. 101-186.

Ray Freeman, A Handbook of Nuclear Magnetic Resonance, Fourier Transformation; pp. 78-85.

Derek Shaw, Biological Magnetic Resonance Imaging: Principles, Methodology, Applications, Chapter I: The Fundamental Principles of Nuclear Magnetic Resonance, Chapter I, pp. 1-46; Chapter 5: High-Resolution Methods Using Local Coils, pp. 191-223.

David R. Lide, CRC Handbook of Chemistry and Physics, 86$^{th}$ Edition 2005-2006; Magnetic Properties of High-Permeability Metals and Alloys (Soft), Properties of Magnetic Materials, pp. 12-104-12-107.

J.M.D. Coey, Permanent Magnet Applications, Journal of Magnetism and Magnetic Materials 248 (2002) pp. 441-456.

L.R. Moskowitz, Permanent Magnet Design and Application Handbook, Chapter 7, pp. 1-49; Chapter 8, pp. 49, 50, 60; Chapter 9, pp. 61-81.

K. Halbach, Design of Permanent Multipole Magnets with Oriented Rare Earth Cobalt Material, Nuclear Instruments and Methods, vol. 169, 1980, pp. 1-10.

Robert J. Cotter, Time-of-Flight Mass Spectrometry, American Chemical Society, Washington, DC. 1997, Chapter 2, pp. 19-45.

A.F. Dodonov et al, Electrospray Ionization on a Reflecting Time-of-Flight Mass Spectrometer, Amer. Chem. Society, 1994, Chapter 7, pp. 108-123.

W.C. Wiley et al, Time-of-Flight Mass Spectrometer with Improved Resolution; The Review of Scientific Instruments, vol. 26, No. 12, Dec. 1955, pp. 1150-1157.

Raymond E. March et al, Quadrupole Ion Trap Mass Spectrometry, Second Edition, Chapter 2, pp. 50-69; Chapter 5, pp. pp. 160-175.L.

R. Moskowitz, Permanent Magnet Design and Application Handbook, Krieger Publishing Co., 1995, pp. 1-961.

Jae C. Schwartz et al, A Two-Dimensional Quadrupole Ion Trap Mass Spectrometer, Focus: Quadrupole Ion Traps, Journal American Society Mass Spectrom 2002, vol. 13, pp. 659-669.

James W. Hager, A New Linear Ion Trap Mass Spectrometer, Rapid Communication In Mass Spectrometry, 2002, vol. 16, pp. 512-526.

Francis W. Karasek et al., Plasma Chromatography, Analytical Chemistry, vol. 48, No. 8, Jul. 1974, pp. 710-720.

Gary Alan Eiceman et al., Ion Mobility Spectrometry, Boca Raton, CRC Press, pp. 1-18.

Guido F. Verbeck et al., A Fundamental Introduction to Ion Mobility Mass Spectrometry Applied to the Analysis of Biomolecules, Journal of Biomolecular Techniques, vol. 13, Issue 2, Jun. 2002, pp. 56-61.

Michael V. Gorshkov et al., High Performance Electrospray Ionization Fourier Transform Ion Cyclotron Resonance Mass Spectrometry at Low Magnetic Field, Eur. J. Mass Spectrom. vol. 8, 2002, pp. 169-176.

G. Mauclaire et al., MICRA: a compact permanent magnet Fourier transform ion cyclotron resonance mass spectrometer, Eur. J. Mass Spectrom., 2004, vol. 10, pp. 155-162.

Jose A. Olivares et al, On-Line Mass Spectrometric Detection for Capillary Zone Electrophoresis, Anal. Chem. 1997, vol. 59, pp. 1230-1232.

Richard D. Smith et al, Capillary Zone Electrophoresis-Mass Spectrometry Using an Electrospray Ionization Interface, Anl. Chem. 1988, vol. 60, pp. 436-441.

Hong Jie Xu et al, A new cooling and focusing device for ion guide, Nuclear Instruments and Methods in Physics Research A 333 1993, pp. 274-281.

* cited by examiner

Arrows showing axial magnetization direction through the rings bodies

Arrows showing axial magnetization direction through the rings bodies

Arrows showing axial magnetization direction through the rings bodies

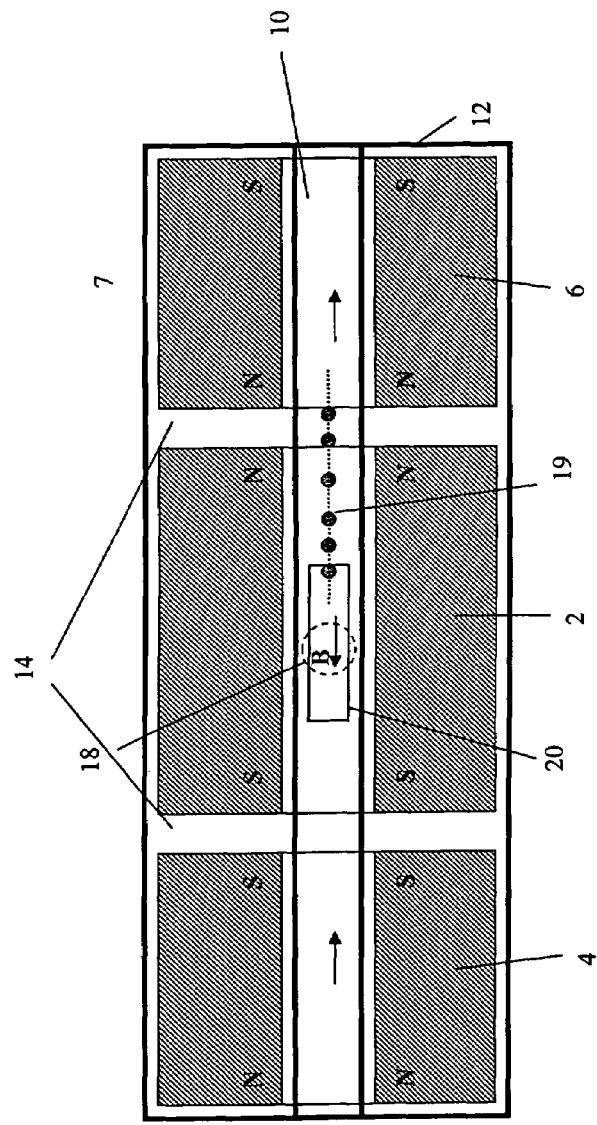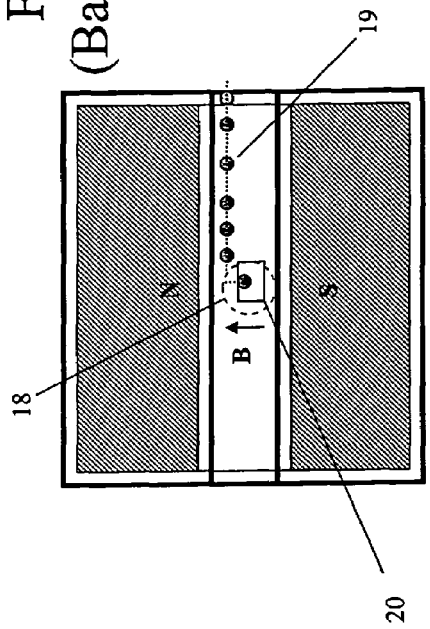
FIGURE 3A
FIGURE 3B (Background Art)

PERMANENT MAGNET STRUCTURE WITH AXIAL ACCESS FOR SPECTROSCOPY APPLICATIONS

DESCRIPTION OF THE RELATED ART

1. Field of the Invention

The present invention relates to magnet structures and particularly to a permanent magnet structure suitable for use in mass spectrometry (MS), nuclear magnetic resonance (NMR), electron paramagnetic resonance (EPR), and magnetic resonance imaging (MRI) spectroscopies.

2. Background of the Invention

Various applications utilizing magnetic fields require fields having high strengths, i.e. high flux densities, and high homogeneity of generated magnetic fields within a space volume large enough to accommodate devices and apparatuses that perform specific tasks within the intended applications.

For example, in Fourier transform mass spectrometers (FTMS) as described in U.S. Pat. No. 3,937,955, issued Feb. 10, 1976; M. V. Buchanan, Ed. Fourier Transform Mass Spectrometry: Evolution, Innovation, and Applications, ACS Symp. Series, 1987, 359, pp. 205; A. G. Marshall, Adv. Mass Spectrom., 1989, 11A, p. 651; A. G. Marshall, L. Schweikhard, Int. J. Mass Spectrom. Ion Proc., 1992, 118/119, p. 37, the entire contents of which are incorporated herein by reference, charged particles are stored inside Penning type ion traps made of a plurality of elements. The size of those traps frequently exceeds 25 mm in all dimensions. The traps are placed inside vacuum chambers of respectively larger size and have to be freely moved in and out of a region of homogeneous high magnetic field. In particular, FTMS traps have to be located along the direction of the magnetic field lines. Since charged particles can be introduced into a strong magnetic field along the magnetic field lines, only the axial access to the ion trap region allows the introduction of ions generated in ion sources external to the ion trap region, such as electrospray ionization (ESI), matrix-assisted laser desorption/ionization (MALDI), atmospheric pressure chemical ionization (APCI), and others as described in M. Yamashita, J. B. Fenn, J. Phys. Chem., 1984, 88, p. 4451; K. Tanaka, H. Waki, Y. Ido, S. Akita, Y. Yoshida, T. Yoshida, Rapid Commun. Mass Spectrom., 1988, 2, p.151; M. Karas, F. Hillenkamp, B. Bachmann, U. Bahr, Int. J. Mass Spectrom. Ion Proc., 1987, 78, p. 53; A. P. Bruins, Mass Spectrom. Rev., 1991, 10, p. 53, U.S. Pat. No. 5,965,884, the entire contents of which are incorporated herein by reference.

In another example, in NMR including Fourier Transform NMR spectroscopy as described in R. J. Abraham, J. Fisher, P. Loftus, Introduction to NMR Spectroscopy, Wiley, Chichester, 1988; J. W. Akitt, NMR and Chemistry: An Introduction to the Fourier Transform-Multinuclear Era, 2$^{nd}$ ed., Chapman and Hall, London, 1983; R Freeman, A Handbook of Nuclear Magnetic Resonance, Longman Scientific and Technical, 1988, the entire contents of which are incorporated herein by reference, a probe mounted on a specially designed holder has to be easily moved in and out of the homogeneous magnetic field that again requires wide axial access, which often exceeds 25 mm in all dimensions, into a region of the high magnetic field.

Yet in another example of MRI spectroscopy as described in F. Wehrli, D. Shaw, J. B. Kneeland, Biological Magnetic Resonance Imaging: Principles, Methodology, Applications, VCH, NY, 1988, the entire contents of which are incorporated herein by reference, such applications require the use of magnetic fields generated in even larger space volume.

In order to obtain high flux densities within large space volume with wide axial access superconducting solenoids have almost exclusively been used. It is also common to employ electromagnets.

Electromagnets require large power supplies for charging and superconducting solenoids require extensive cooling systems to maintain the solenoid below the requisite critical low temperature. Liquid helium is typically used and is typically replenished periodically to cool the magnet, which makes the magnet inherently large and expensive. Not only do these attributes increase the cost of high powered electromagnets, but such approaches also diminish, if not eliminate, the portability of electromagnets due to their large size and weight, especially those capable of generating strong magnetic fields.

Permanent magnets offer an alternative magnetic flux source to electromagnets and superconducting solenoids, and do not require large power supplies or cooling systems. Nonetheless, permanent magnets in the past have been unable to generate magnetic flux densities commensurate with electromagnets. Recent advances in magnetic materials, however, have greatly increased the magnetic flux densities generated by permanent magnet systems. For example, the use of rare-earth metals such as Neodymium (Nd) and Samarium (Sm) have increased the strength of permanent magnets. The most widely used materials for permanent magnet systems are currently NdFeB and SmCo, and the variety of available magnetic materials and their properties can be found in Table of Magnetic Materials, from CRC Handbook of Chemistry and Physics, CRC Press, Inc. 1993; L. R. Moskowitz, Magnetic & Physical Properties of Permanent Magnet Materials and International Index-Cd-Rom, Krieger Pub Co; CD-Rom edition, 1998; J. M. D. Coey, J. Magn. Magn. Mater, 2002, 248, p. 241, the entire contents of which is incorporated herein by reference. Furthermore, arrangement techniques employing these materials have resulted in permanent magnets that can produce magnetic fields having flux densities above 1 T.

Employing permanent magnets in the mentioned above applications to obtain a high flux density and homogeneity of the generated magnetic field has been accomplished utilizing the U-shape permanent magnets having a yoke as described in L. R. Moskowitz, Permanent Magnet Design and Application Handbook, Krieger Publishing Company, 1995, pp. 1-961, the entire content of which is incorporated herein by reference, or by the dipolar ring magnet systems being constructed of a plurality of permanent magnets alone as was disclosed in K. Halbach, Nuclear Instruments and Methods, 1980, 189, p. 1, the entire content of which is incorporated herein by reference. However, the former structures can result in bulky magnet assemblies that require large consumption of permanent magnet material to generate uniform high magnetic field, and the latter generate a uniform high magnetic field perpendicular to the direction of the axial access inside the bore of assembly constructed from ring-shape magnets.

Therefore, utilizing any of the above two structures results in (1) limited access to the central region of the homogeneous magnetic field; (2) limited space to place a device such as charged particle trap, particle (charged or neutral) detector, or NMR probe; and (3) limited capabilities to couple a charged particle trap, or a particle detector, with the charged or neutral particle transport systems when those particles are generated outside the magnet. The latter case covers, for example, mass spectrometers with atmospheric pressure ionization sources such as ESI, MALDI, APCI, etc., or other types of mass spectrometers, such as FTMS, time-of-flight (TOF) as described in R. J. Cotter, Time-of-Flight Mass Spectrometry: Instrumentation and Applications in Biological Research, ACS Professional Reference Books, Washington, DC, 1997, pp. 1-327; W. C. Wiley, I. H. McLaren, Rev. Sci. Instr., 1955, 26, p.1150; A. F. Dodonov, I. V. Chernushevich, V. V. Laiko, in Time-of-Flight Mass Spectrometry, Ed. R. J. Cotter, American Chemical Society, Washington, DC, 1994, p. 108, the entire contents of which are incorporated herein by reference.

Other mass spectrometers include radio-frequency two-dimensional (LIT, LTQ) or three-dimensional ion traps (ITMS, QIT) as described in R. E. March, R. J. Hughes, Quadrupole Storage Mass Spectrometry, John Wiley & Sons, NY, N.Y., 1989, pp. 1-471; J. C. Schwartz, M. W. Senko, J. E. P. Syka, J. Am. Soc. Mass Spectrom., 2002, 13, p. 659; J. W. Hager, Rapid Commun. Mass Spectrom., 2002, 16, p. 512; German Patent No. 944,900, U.S. Pat. Nos. 2,939,952; 3,065, 640; 4,540,884; 4,882,484; 5,107,109; 5,714,755, 6,403,955 and U.S. patent applications Nos. 20030183759, 20050017170, the entire contents of which are incorporated herein by reference.

Other mass spectrometers include ion mobility spectrometers (IM, MMS) as described in F. W. Karasek, Anal. Chem., 1974, 46, pp. 710A-720A; G. A. Eiceman, Z. Karapas, Ion Mobility Spectrometry, Boca Raton, CRC Press, 1994, pp. 1-15; G. F. Verbeck, B. T. Ruotolo, H. A. Sawyer, K. J. Gillig, D. H. Russell, J. Biomolecular Technique, 2002, 13, p.56, the entire contents of which are incorporated herein by reference, or combinations thereof, having external out-of-vacuum and in-vacuum generation of charged particles, which are usually transported through various differential pumping stages to the mass spectrometry analyzer.

If, for example, FTMS trap is used as a mass spectrometry analyzer that traps charged particles along the magnetic field flux direction and the direction is perpendicular to the axis along which the charged particles move from the mass spectrometry devices or particle sources outside the magnet, there are difficulties in coupling such devices or sources with the analyzer. The coupling will require an implementation of a mechanism to turn the particle beam by 90 degrees before injecting the ions into the FTMS trap that further restricts the size of the said trap and, therefore, limit the performance of the FTMS analyzer as described in M. V. Gorshkov, H. R. Udseth, G. A. Anderson, R. D. Smith, Eur. J. Mass Spectrom., 2002, 8, pp. 169-176, the entire contents of which are incorporated herein by reference.

In another example, Halbach cylinders based permanent magnet structure were employed in FTMS system as described in G. Mauclaire, J. Lemaire, P. Boissel, G. Bellec, M. Heninger, Eyr. J. Mass Spectrom., 2004, 10, pp. 155-162. In that configuration, the magnet had an axial access through a 5 cm bore into a central region with FTMS trap analyzer. The direction of the magnetic field inside the bore was perpendicular to the axis of the bore. A source of electrons to generate the ions inside the trap was mounted along the magnetic field direction thus restricting the size of the trap to 2 cm. As a consequence, the mass spectrometer performance and upper limit of mass of ions that could be trapped were limited.

SUMMARY OF THE INVENTION

One object of present invention is to eliminate or overcome the limitations imposed on spectroscopy applications by providing homogeneous magnetic fields in large spatial volumes within magnet structures having through-holes for axial access to that working volume.

Still another object of the present invention is to provide a magnet flux source that can maximize the flux density generated per weight of magnetic material.

Still another object of the present invention is to provide axial access to the working volume along the direction of the magnetic field lines for applications in mass spectrometry, nuclear magnetic resonance spectroscopy, magnetic resonance imaging, ion mobility spectrometry, and electron paramagnetic resonance spectroscopy referred to hereafter as spectrometry.

In accordance with various of these objects, the present invention provides in one embodiment a magnet structure or instrument for spectroscopy including a plurality of magnetic flux sources disposed along a common axis. The plurality of permanent magnetic flux sources include a first magnet flux source having a first through-hole body, and include second and third magnet flux sources located respectively on opposite sides of the first magnet flux source, with at least one of the second and third magnet flux sources having a side through-hole body. Magnetic flux within the first magnet flux source is oriented to generate a first magnetic field directed along the common axis. Respective magnetic fluxes within the second and third magnet flux sources are oriented to generate second and third magnetic fields directed along the common axis, with at least one field component of either the second or third magnetic fields along the common axis inside the respective second or third magnet flux sources opposed to a direction of the first magnetic field on said common axis inside the first magnet flux source.

In various embodiments of the present invention, the plurality of magnetic flux sources can be hollow body flux sources with air bores as through-holes in the hollow body flux sources, each hollow body flux source generating a magnetic field inside the bores. The sources can be located sequentially one after another along the same axial line. The magnetic fields within the sources can be oriented in a way to generate a coherent and uniform magnetic field inside the open central region of the structure having a flux density greater than the residual flux density. The hollow body flux sources can have in general cylindrical shapes, each defined by a length along the common axis, an internal diameter of the bore, and an outside dimension of a housing of the hollow body. The axial direction can be disposed parallel to the magnetic flux lines generated inside the through-hole in the central flux source (i.e., the above-noted first flux source). The hollow body flux sources may also have other shapes such as elliptic or rectangular. The hollow body sources are permanent magnet structures that increase the flux density per weight of magnet material.

In various embodiments of the present invention, the hollow body flux sources can be made in the form of tubes with the bores (i.e., through-holes) along the common axis and having dimensions for the through-holes large enough to accommodate different types of physical devices or sample objects that can be freely moved in and out along the axis of the bores.

In various embodiments of the present invention, the magnetic field flux near the common axis along a hollow volume parallel to the common axis can permit transfer of charged electric particles (e.g., ions or electrons) from outside of the magnet structure to the central test volume inside the magnet.

In various embodiments of the present invention, the hollow body flux sources can be made of magnetic materials or incorporate magnetic materials of high magnetic properties. The hollow body sources are configured to have directions of magnetization such as to reduce magnetic flux leakage from the central regions such as to focus flux density lines into a central air gap in the first or central flux source.

In various embodiments of the present invention, a plurality of magnetic flux sources can generate a reversible magnetic field (RMF) profile inside the through-holes and along the common (i.e., longitudinal) axis. Reversible in this context means that the polarity of the magnetic flux reverses its directions along the common axis.

It is to be understood that both the foregoing general description of the invention and the following detailed description are exemplary, but are not restrictive of the invention.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein:

FIGS. 3A and 3B are composite schematics comparing one preferred permanent magnet structure of the present invention in FIG. 3A to the permanent magnet structure based on Halbach cylinders in FIG. 3B;

DETAILED DESCRIPTION OF THE PREFERRED EMBODIMENTS

While the invention will be described in connection with certain preferred embodiment, there is no intent to limit the present invention to those embodiments. On the contrary, all alternatives, modifications and equivalents as included within the spirit and scope of the invention are part of the present invention.

For the purpose of this invention a spectrometer can be any of mass spectrometer (MS), nuclear magnetic resonance (NMR) spectrometer, electron paramagnetic resonance (EPR) spectrometer, and magnetic resonance imaging (MRI) spectrometer, ion mobility spectrometer (IMS), or any combination thereof.

For the purpose of this invention a mass spectrometer can be any of (but not limited to) mass spectrometry of ion cyclotron resonance with or without Fourier transform to generate mass spectra, time-of-flight mass spectrometry, quadrupole mass spectrometry, and radio-frequency ion trap mass spectrometry, wherein the trap can be either three-dimensional or two-dimensional (linear); or any combination thereof.

Figure 1:
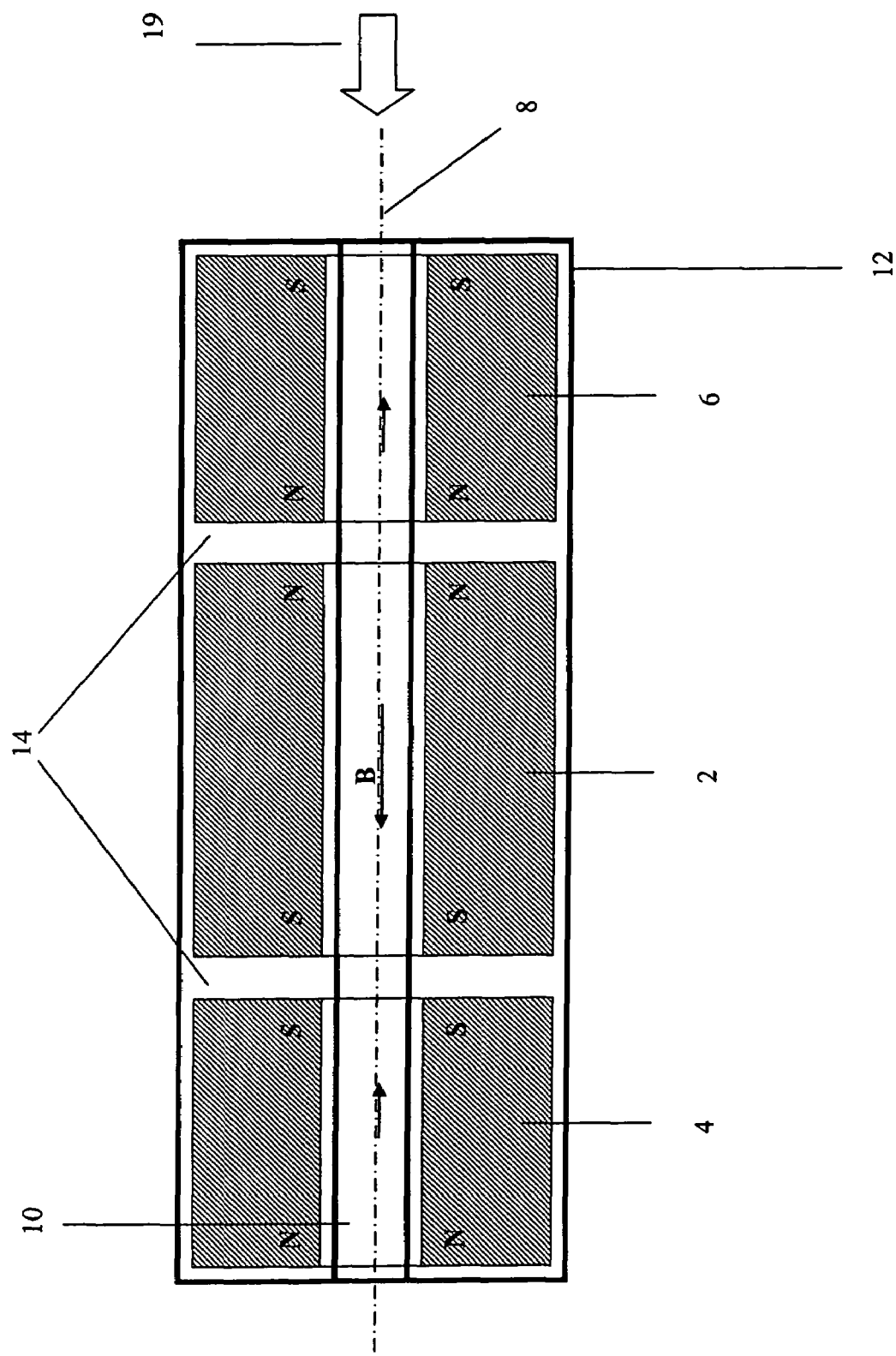
FIG. 1 is a schematic representation in plain view of one of the preferred embodiments of the magnet structure of the present invention.
Figure 2A:
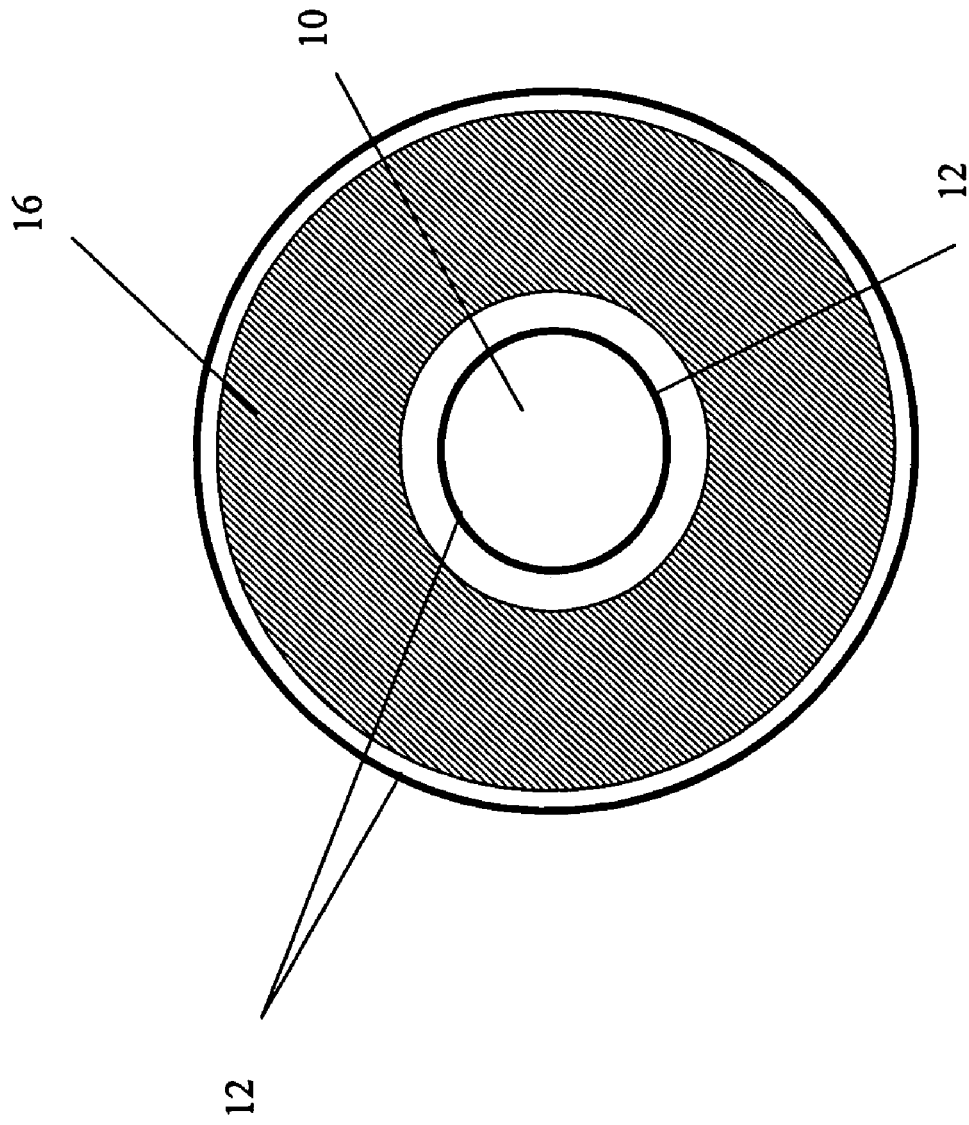
FIG. 2A is a schematic representation in a cross-sectional view of one preferred permanent magnet structure of the present invention.

Referring now to the drawings, wherein like reference numerals designate identical, or corresponding parts throughout the several views, one preferred embodiment of the present invention, as represented in FIG. 1 and FIG. 2A, can include, as magnet flux sources 2, 4, and 6, hollow body flux sources that can have, but are not limited to, a generally cylindrical shape extending along a common axis 8. The hollow body sources can have an internal diameter defined by a through-hole 10 that extends along the common axis 8. The hollow body sources are defined by the outside surfaces of the housing 12. The magnet flux sources 2, 4, and 6 are preferably but not necessarily located aligned on the common (i.e., longitudinal axis) 8 in such a way that central axial magnetic field lines from the flux sources coincide with each other.

As such, the magnet structure of the present invention can be a set of permanent-magnet hollow body sources as shown in FIGS. 1 and 2A. having a central hollow body source 2 and adjacent hollow body sources 4 and 6, located at both ends of the central hollow body source 2 and structured in such a way that there are gaps 14 between the central hollow body source 2 and the respective adjacent hollow body sources 4 and 6.

The distance of the gap between the flux sources is varied as noted above. Distances up to 5 mm have been used. For larger magnets, this distance can be varied more. For large size magnets a gap separation distance of more than 5 mm will still produce concentration of the central flux field. In general, one can consider the gap separation to be preferably less than twice the size of the bore (or through-hole inside diameter) of the central flux source. The gap separation should preferably be as small as possible in order to generate the maximum magnetic field inside the central hollow body source.

In one preferred embodiment, as represented in FIG. 1, the gaps are variable. The magnetic field in the central hollow body source 2 is directed along the axis of the bore and is generally dipolar. The variable gaps 14 between the central hollow body source 2 and the adjacent hollow body sources 4 and 6 further provide a mechanism to adjust the homogeneity of the magnetic field in the central region of the central hollow body source 2. The homogeneity of the magnetic field in the central region can be further improved by room temperature coil shimming similar to that in superconducting solenoids, or by incorporation of additional magnetic materials inside the central region.

In a preferred embodiment, as schematically represented in FIG. 2A, ring-shaped structures 16 made of magnetic materials are incorporated inside the housing 12 made of either non magnetic, or magnetic material. The housing can be made of either a non-magnetic material, and thus has no influence on the magnetic field, or a magnetic material, and thus, having influence on magnetic field generated by sources. The housing from magnetic materials can shield the outside environment from magnetic field.

In one embodiment of the present invention, the ring shape structures 16 will be formed by using solid rings of magnetic materials that once magnetized axially would slipped into each other to form hollow cylinders of desired lengths. In general, large size rings made of high power magnetic materials may not be available, and, therefore, the rings from smaller segments and assembled to form the ring shaped structures 16 shown in FIG. 2A can be used. In this configuration, the ring shaped structure housing 12 hold the segments of magnetic material together. A variety of such constructs to hold the segments of the magnetic material together are possible according to the present invention.

Figure 2B:
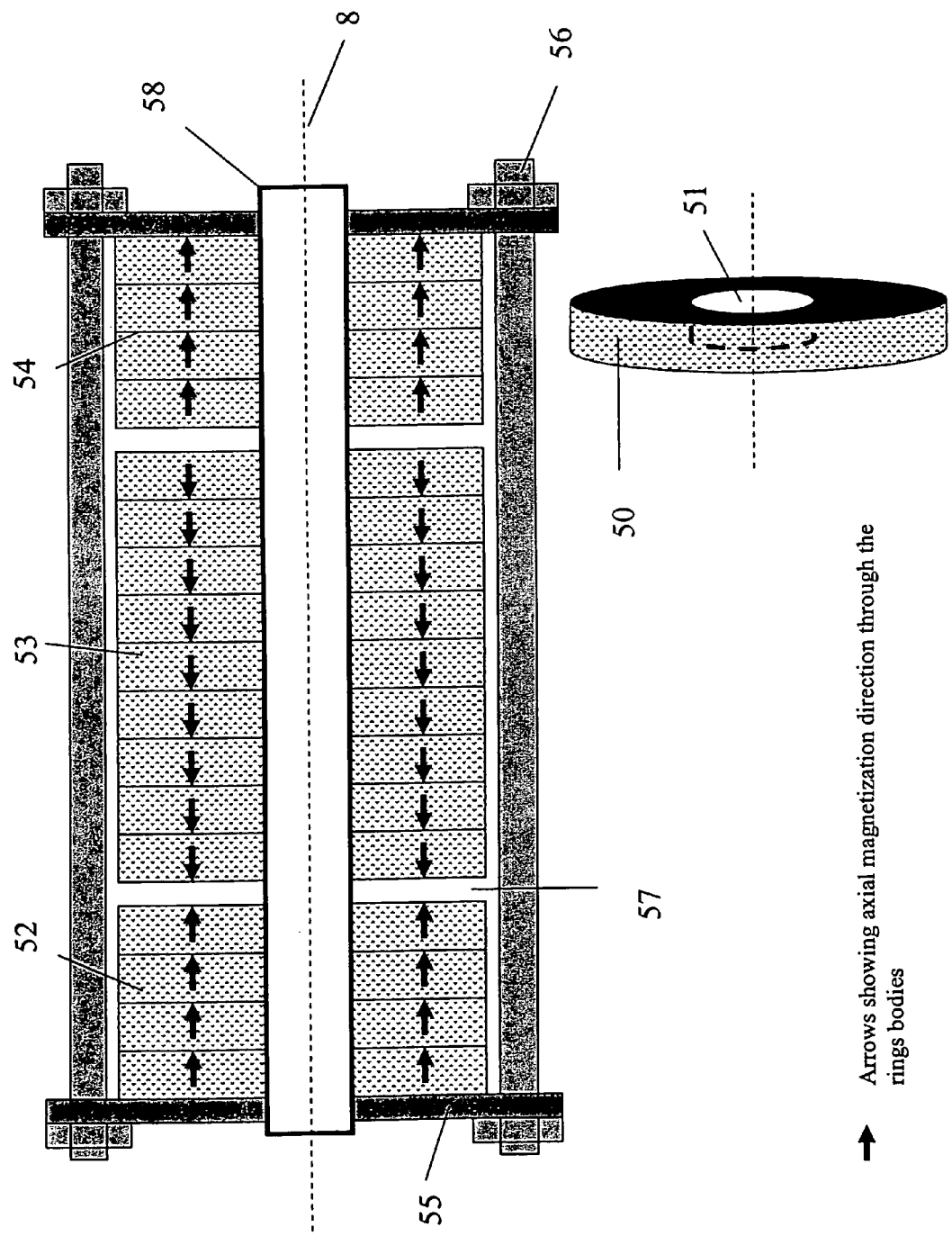
FIG. 2B, 2C, and 2D are schematic representations showing different embodiments for holding the permanent magnetic material of the present invention.
Figure 2C:
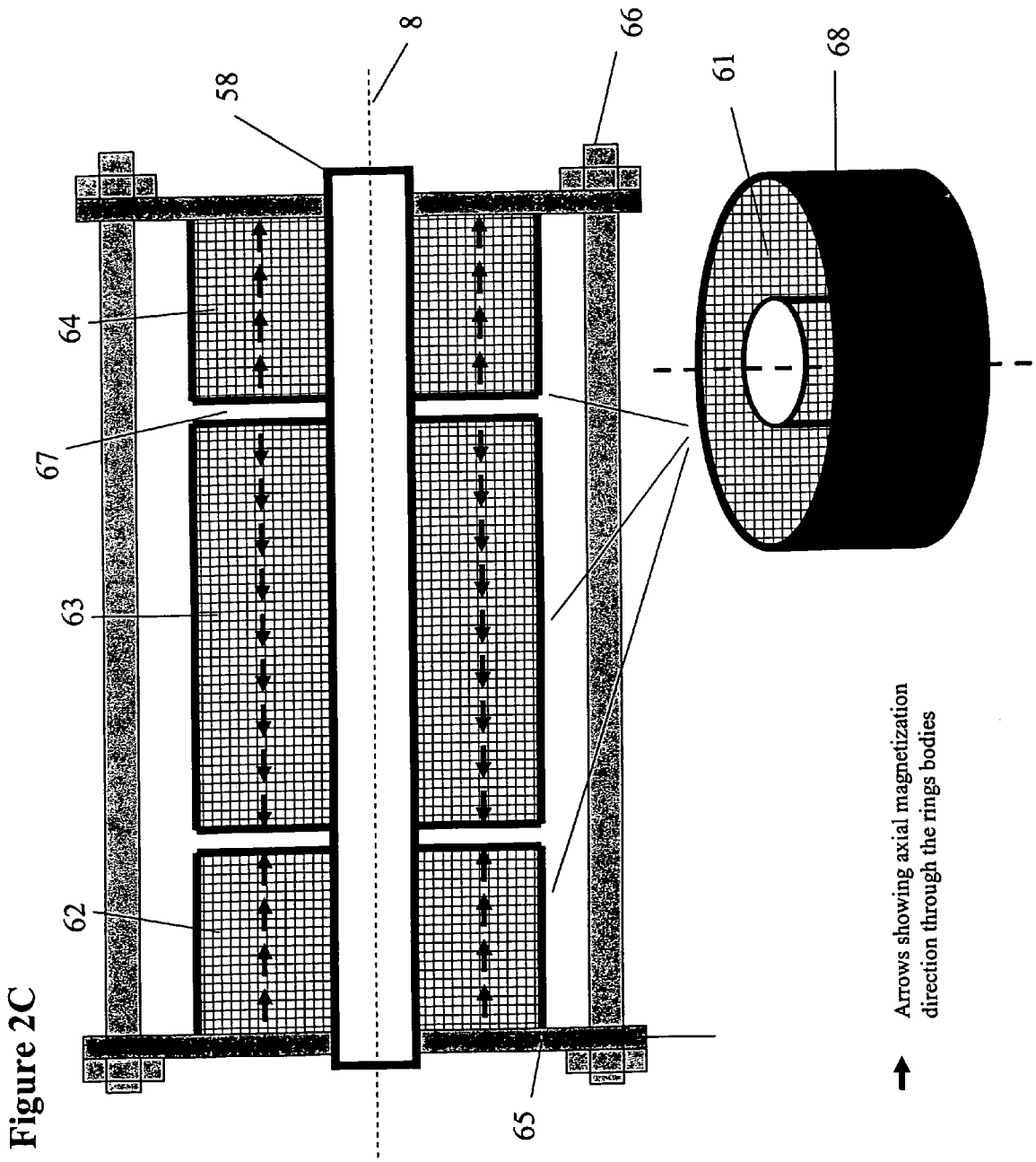
Figure 2D:
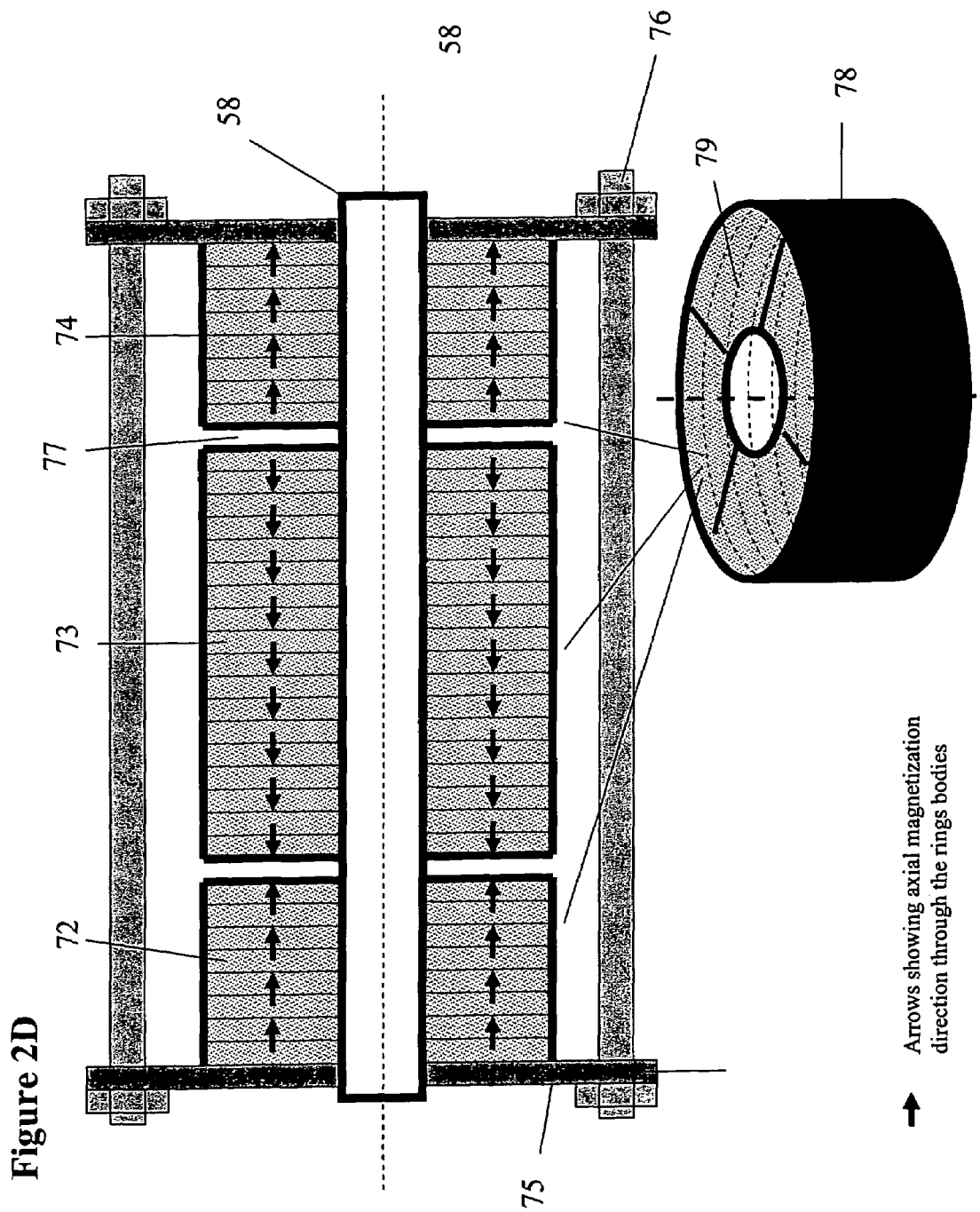

Shown in FIGS. 2B, 2C, and 2D are several illustrative examples of these constructs. Basically, magnetic material in different forms (for example ring shape segments, small rectangular blocks, etc.) is packed inside the cylindrical (or elliptic, rectangular, or other shapes) through-hole cans. In case of magnetic material in the form of whole rings or cylinders, the magnetic materials need not necessary to be packed inside the cans. Before packing, the cans segments are magnetized in defined directions and packing them into cans is performed according to the magnetization direction. In other words, the packing is made such that the magnetization directions of the can segments coincide with the desired magnetization needed inside at least one of the magnet flux sources 2, 4, and 6. Alternatively (and if the sources are not too large), the cans packed with segments, and then can be magnetized thereafter with specified directions. The through-holes 10 in any of these structures while shown as cylindrical need not be perfectly cylindrical and further can be either of a cylindrical, square, elliptical shape, or other shapes.

More specifically, FIG. 2B shows a magnet structure of the present invention assembled from solid magnetic rings 50 having a central through-hole 51. As shown in FIG. 2B, three sets 52, 53, and 54 each assembled from the solid magnetic rings 50 employing the attraction between the rings 50 in each set are disposed adjacent to each other. Because of reversed magnetization between the sets 52, 53, and 54, there is strong repelling force between the sets. Two metal rings 55 connected with each other from both sides of the assembly by threaded rods 56 can prevent the sets 52, 53, and 54 from repelling, but other suitable retaining devices can be used in the present invention. In this embodiment, the rods 56 can be threaded to have the possibility to adjust gaps 57 between the sets 52, 53, and 54. Alternatively or in addition, the gaps may be filled with a non-magnetic material such as aluminum to provide additional support to the assembly. No special housing around the rings 55 is needed, but maybe useful nonetheless in this embodiment, for example, to protect the magnetic rings 50. A tube 58 (of any non-magnetic material including plastic) with outside diameter to fit the through holes and inside diameter to accommodate an inserted device or apparatus can be used.

More specifically, FIG. 2C shows a magnet structure of the present invention assembled from cylinders 62, 63, and 64 made of magnetic materials 61. Because of reversed magnetization, there is a strong repelling force between the three cylinders 62, 63, and 64. Two metal rings 65 connected with each other from both sides of the assembly by threaded rods 66 can prevent the cylinders 62, 63, and 64 from repelling, but other suitable retaining devices can be used in the present invention. In this embodiment, the rods 66 can be threaded to have the possibility to adjust gaps 67 between the cylinders 62, 63, and 64. Alternatively or in addition, the gaps may be filled with a non-magnetic material such as aluminum to provide additional support to the assembly. The cylinders can be made from a cylindrical can 68 filled with smaller size rectangular segments. Segments are made of magnetic materials and magnetized along the cylinder axis, or at the angle to the axis, the angle can be the same for all segments. The cylindrical can 68 can be covered by ring caps from both open sides. The cylindrical can 68 can be made of any non-fragile material including plastics. Segments, which fill the cylindrical cans, can be of different sizes to meet the requested size of the permanent magnet structure.

More specifically, FIG. 2D shows a permanent magnet structure of the present invention assembled from magnetized ring shape segments. As shown in FIG. 2D, three sets 72, 73, and 74 each assembled from the magnetized ring shape segments 71 are disposed adjacent to each other. Because of reversed magnetization between the sets 72, 73, and 74, there is strong repelling force between the sets. Two metal rings 75 connected with each other from both sides of the assembly by threaded rods 76 can prevent the sets 72, 73, and 74 from repelling, but other suitable retaining devices can be used in the present invention. In this embodiment, the rods 76 can be threaded to have the possibility to adjust gaps 77 between the sets 72, 73, and 74. Alternatively, the gaps may be filled with a non-magnetic material such as aluminum to provide additional support to the assembly. Each set may consist of a cylindrical can 78 that can be made of any non-fragile material including plastics and packed with ring shape segments 79. Segments 79 are made of magnetic materials and in various embodiments magnetized along the cylinder axis, or in other embodiments at the angle to the axis 8, the angle preferably but not necessarily being the same for all the segments. Segments, which fill the cylindrical cans 78, can be of different polar angle sizes. The cylindrical can 78 can be covered by ring caps from both open sides.

The housing 12 is configured to hold the magnetized materials in the ring-shaped structures 16 together to generate a predetermined magnetic field flux inside the hollow regions of the magnet flux sources 2, 4, and 6. The ring shape structures 16 can be either cylinders, or sets of rings, or sets of segments, which form an array of magnet materials having for example a cylindrical symmetry. Other suitable housing and structure geometries could be used to produce a predetermined magnetic field flux in the central region of the magnet flux sources 2, 4, and 6.

Figure 7:
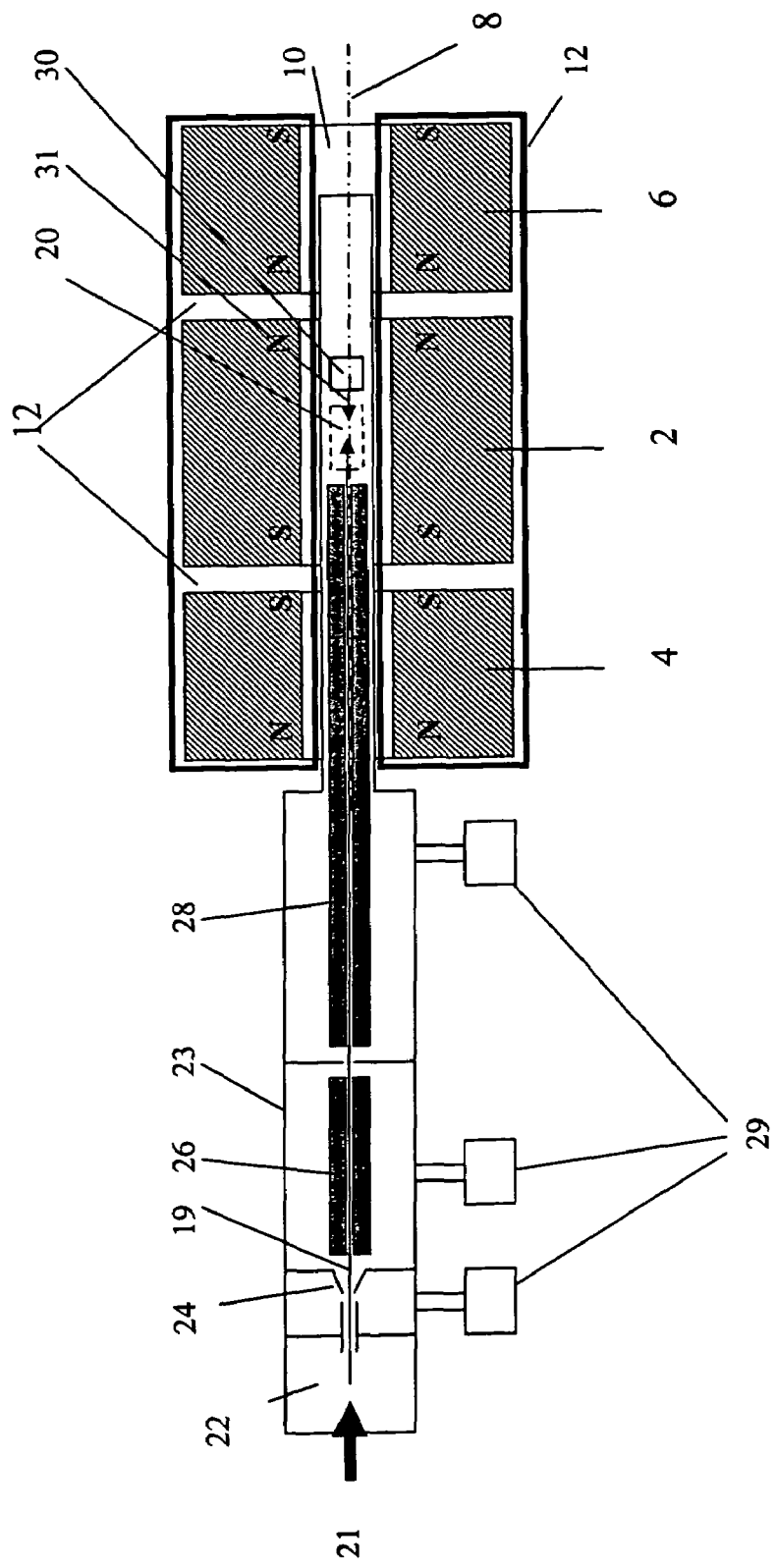
FIG. 7 is a schematic depicting the utilization of the magnet structure according to an embodiment of the present invention with a Fourier Transform Ion Cyclotron Resonance mass analyzer.

FIG. 3A and 3B show schematically the principal difference between the directions of the dipolar magnetic field fluxes generated inside the through-holes 10 of one preferred magnet structure in FIG. 3A and the magnet structure based on Halbach cylinders in FIG. 3B employed previously in the FTMS mass spectrometry system described in G. Mauclaire, J. Lemaire, P. Boissel, G. Bellec, M. Heninger, Eyr. J. Mass Spectrom., 2004, 10, pp. 155-162, the entire contents of which are incorporated herein by reference. In the former case according to the present invention, the dipolar magnetic field flux direction in the central working volume 18 is parallel to the common axis 8, and therefore a charged particle beam 19 entering the working volume 18 along the common axis 8 from regions outside the magnet structure will be introduced directly into for example an FTMS trap 20 which is aligned along the same axis. FIG. 7 shows an illustration of the utilization of the magnet structure of the present invention with an FTMS trap. In the Halbach structure (FIG. 3B), the dipolar magnetic field flux direction in the central working volume is perpendicular to the common axis and therefore any charged particle beam incoming into the working volume along the common axis from the regions outside the magnet will have to be turned by 90 degrees before being trapped and analyzed by FTMS trap.

In general, the magnet structures of the present invention need not be exclusively permanent magnets. Indeed, the magnet structures of the present invention could use electromagnets to supplement (as in the electromagnet shims described above) or replace the permanent magnets described above.

While electromagnets have some known disadvantages over permanent magnets, electromagnets offer the flexibility of elimination or modulation of the magnet flux with time in the plurality of sources in the present invention. Such electromagnets could include superconducting coils, As such, the present invention is not necessarily limited to the preferred permanent magnets described above, but rather can utilize any magnet structure to generate the opposing magnetic fields in adjacent flux sources to the central flux source in order to concentrate the central magnetic flux.

It is known for FTMS traps (e.g., Penning type traps) that the trapping is realized in two planes: (1) along the magnetic field line direction, the ions are trapped by electric field which forms a potential well along this direction; (2) in the plane perpendicular to the magnetic field line direction, the ions are trapped by a Lorentz force. Therefore, if the ions move through a working volume of a Halbach magnet, the ions move in a plane perpendicular to the magnetic field line direction, and to realize trapping by an electric field along this direction the ions have to be turned by 90 degrees before being injected into a FTMS trap. For this reason and others, existing approaches to create FTMS mass spectrometers with Halbach type magnets have had difficulty in interfacing with external ion sources. The magnet structure of the present invention addresses this problem because, in the working volume 18 of the magnet structure, ions will enter the through-hole 10 of the central flux source 2 and approach for example a FTMS trap along the magnetic field lines and therefore are trapped in a similar way as in existing FTMS mass spectrometers employing superconducting solenoid type magnets that permit coupling to external ionization sources.

Indeed, to move across magnetic lines, ions need to have high energy so that the trajectory radius is high enough for ions originating outside to reach the ICR cell located inside the Halbach type magnet. According to estimations, to have the trajectory radius r=1 m in the magnetic field B=1 T, ions need to have an energy about 100 keV, which is not practical. This is one reason why a Halbach type magnet may not be readily used in a FTICR-MS with an external ion source.

Thus, the magnet structure of the present invention does not impose any additional energy requirements on the ion source ions. Additionally, charged particles can be transported along the common axis 8 of the through-hole 10 so as not to impose any size restriction on the ion transport, unlike in the Halbach type magnet structure in which the particles have to be transported near the inner surface of the through-hole 10 before being turned by 90 degrees for trapping. Furthermore, these advantages of the magnet structure of the present invention are realized without diminution of the magnetic field strength in the working volume 18.

Figure 4A:
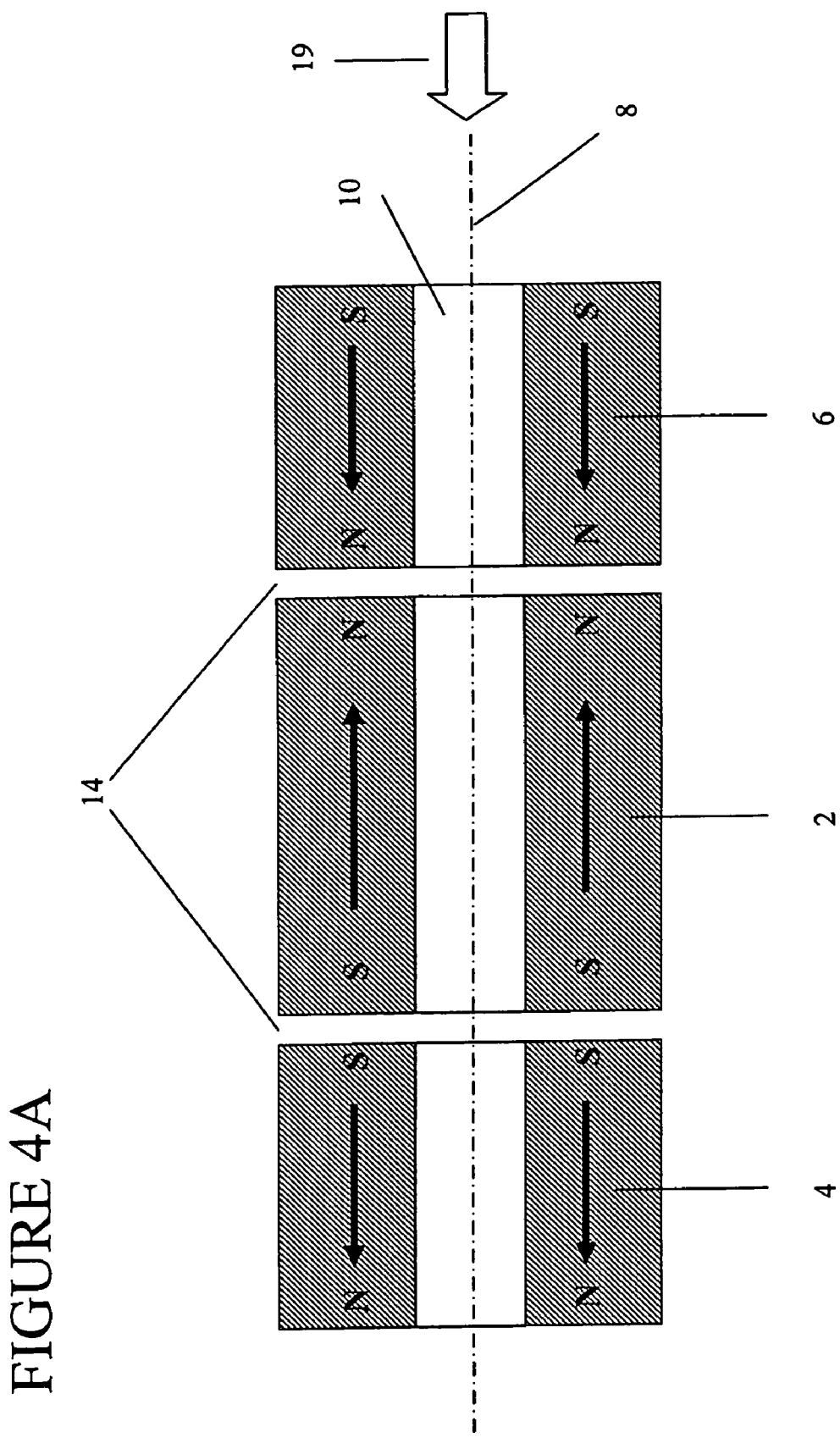
FIG. 4A is a schematic depicting one of the alternative directions of magnetization of the magnetic materials inside a magnetic medium of the hollow body flux sources according to an embodiment of the present invention.
Figure 4B:
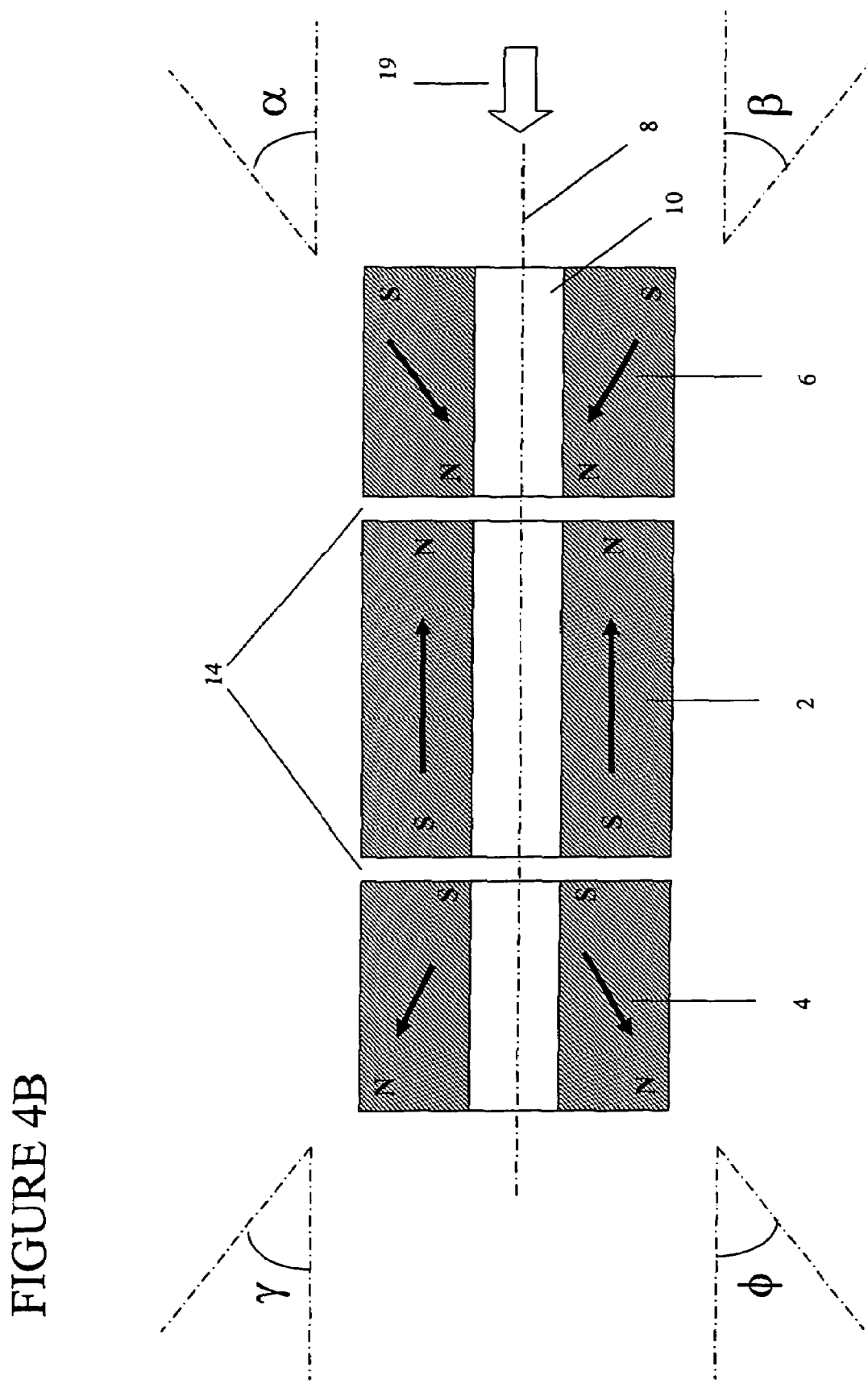
FIG. 4B is a schematic depicting another direction of magnetization of the magnetic materials inside a magnetic medium of the hollow body flux sources according to an embodiment of the present invention.

FIG. 4A is a schematic depicting one configuration of the present invention having alternating directions of magnetization of the magnetic materials inside the hollow body flux sources of the present invention. FIG. 4B is a schematic depicting another configuration of the present invention for the direction of magnetization inside the hollow body flux sources of the present invention. As schematically represented in FIGS. 4A and 4B, the resultant magnetic fields in the adjacent hollow body sources 4 and 6 are directed either along the common axis 8 of the respective through-holes 10, or at an angle to the common axis 8 of the respective through-holes 10. In the latter case, the direction of the magnetic field has a radial component and possesses cylindrical symmetry. The magnetic fields in the adjacent hollow body sources 4 and 6 are generally dipolar in character. The polarities of the magnetic field generated by the central hollow body source 2 at the respective ends of central hollow body source 2 along the axis are opposite to the polarities of the magnetic fields generated by adjacent hollow body sources 4 and 6 at the respective ends adjacent to the central hollow body source 2 along the common axis 8.

In this configuration, the permanent magnet exhibits a higher flux density in the center of the through-hole 10 of the central hollow body source 2 while minimizing the amount of magnetic material used, the size of the permanent magnet structure, and the weight of the permanent magnet structure by reducing the magnetic flux leakage and focusing the flux density lines into the working volume 18 of the central hollow body source 2. In one embodiment of the present invention, a plurality of permanent magnet segments are used including magnetic materials having a coercivity greater than 500 Oersteds. As illustrated, in FIG. 4B, the second and third flux sources (i.e., the non-central flux sources) can be configured to generate second and third dipolar magnetic fields directed at an angle between −90 and +90 degrees to the common axis.

In general, the magnetization direction inside magnetic flux sources adjacent the central magnetic flux source can be at any angle between being axially magnetized or magnetized perpendicular to the common axis 8. The present inventor has determined that, for the field strength in the central magnetic flux source 2, the perpendicular magnetization of the side magnetic flux sources 4 and 6 (when the vector of magnetization of all magnets comprising the source 4 is directed outward the common axis and the vector of magnetization of all magnets comprising the source 6 is directed toward the common axis) gives higher field strength inside the central source 2. However, perpendicular magnetization is not always possible for ring shape magnets, and some magnetic materials may not permit such a perpendicular direction of magnetization. In this case the ring shape magnets can be constructed of smaller parts having desired magnetization. The shape of smaller parts can be any ranging from rectangular pieces to arc segments. Regardless, the magnetization direction for the magnet structure of the present invention preferably reverses along the common axis, as shown in the figures. Suitable permanent magnetic materials for the present invention include, but are not limited to, Nd, Sm, NdFeB, SmCo, Alnico alloys, Ferrite (Ceramic) magnets, and other permanent magnet alloys. The magnetic materials utilized in each of the flux sources 2, 4, and 6 can be of different type. For example, central source 2 can be made of rare-earth magnetic materials, such as NdFeB and/or SmCo, while side flux sources 4 and 6 can be made of other permanent magnet alloys.

Figure 5:
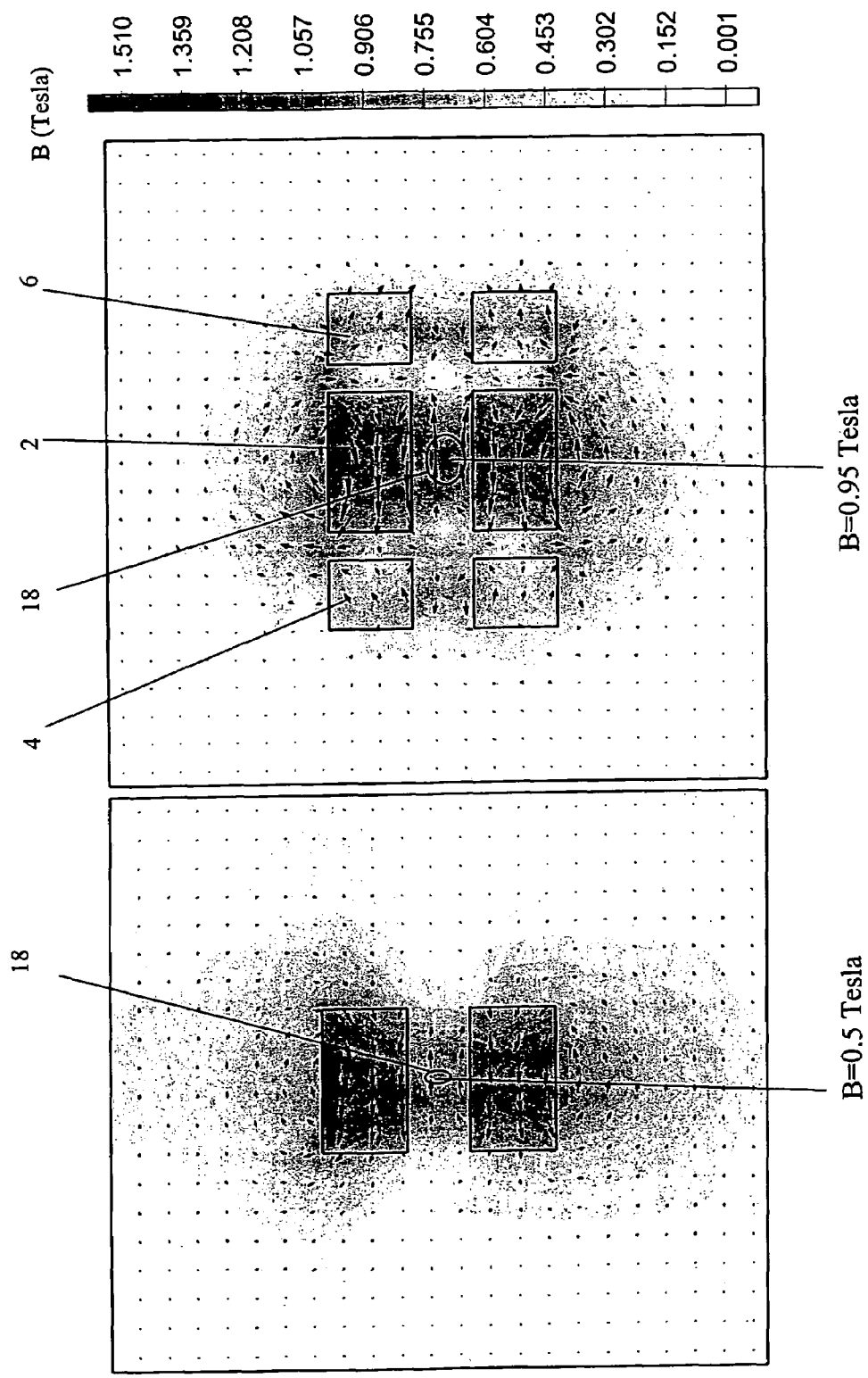
FIG. 5 is a schematic depicting results of the calculations of the magnetic field fluxes generated by the permanent magnet structure according to an embodiment of the present invention and a structure based on a single hollow cylinder containing magnetic materials magnetized to generate magnetic field flux along the bore axis.

FIG. 5 shows results of calculations of the magnetic field fluxes generated by an embodiment of the magnet structure according to the present invention and the structure based on a single hollow cylinder containing magnetic materials magnetized to generate magnetic field flux along a common axis. Calculations were made for structures made of the same magnetic materials and having the same through-hole 10 and working volume 18 dimensions. The calculations show that the magnet structure of the present invention effectively focuses magnetic flux generated by the central hollow source 2 inside the working volume 18, and can result in almost a two-fold increase in magnetic field strength inside the working volume 18 of the central hollow body source 2. In addition, the region of homogeneous magnetic field generated by magnet structure of the present invention (which defines the extent of the practical working volume) is larger along the common axis by two-fold as compared to the single hollow cylinder. Further, the homogeneity of the magnetic field can be adjusted by varying the gaps 14 between the central hollow body flux source 2 and the adjacent hollow body flux sources 4 and 6.

In general, the permanent magnet structure as described in FIGS. 1 and 4 creates a reversible magnetic field along the common axis 8 of the magnet structure such that a north pole (N) of the orientation of the magnetic flux in the central hollow body flux source 2 faces a north pole (N) of the orientation of magnetic flux generated by one of the adjacent hollow body flux sources 4 and 6 at the respective end of the central hollow body source along the common axis 8. Meanwhile, the south pole of the orientation of magnetic flux in the central hollow body flux source 2 faces a south pole of the orientation of magnetic flux generated by the other adjacent hollow body flux source at the respective end of the central hollow body source along the same common axis 8. Arranged in such a way, the adjacent hollow body flux sources 4 and 6 focus the magnetic flux inside the central hollow body flux source 2 and minimizes the magnetic flux leakage. Note, that the polarity of the magnetic field flux along the common axis 8 reverses along the common axis near the ends of the central hollow body source 2 as shown schematically in FIG. 6.

Figure 6:
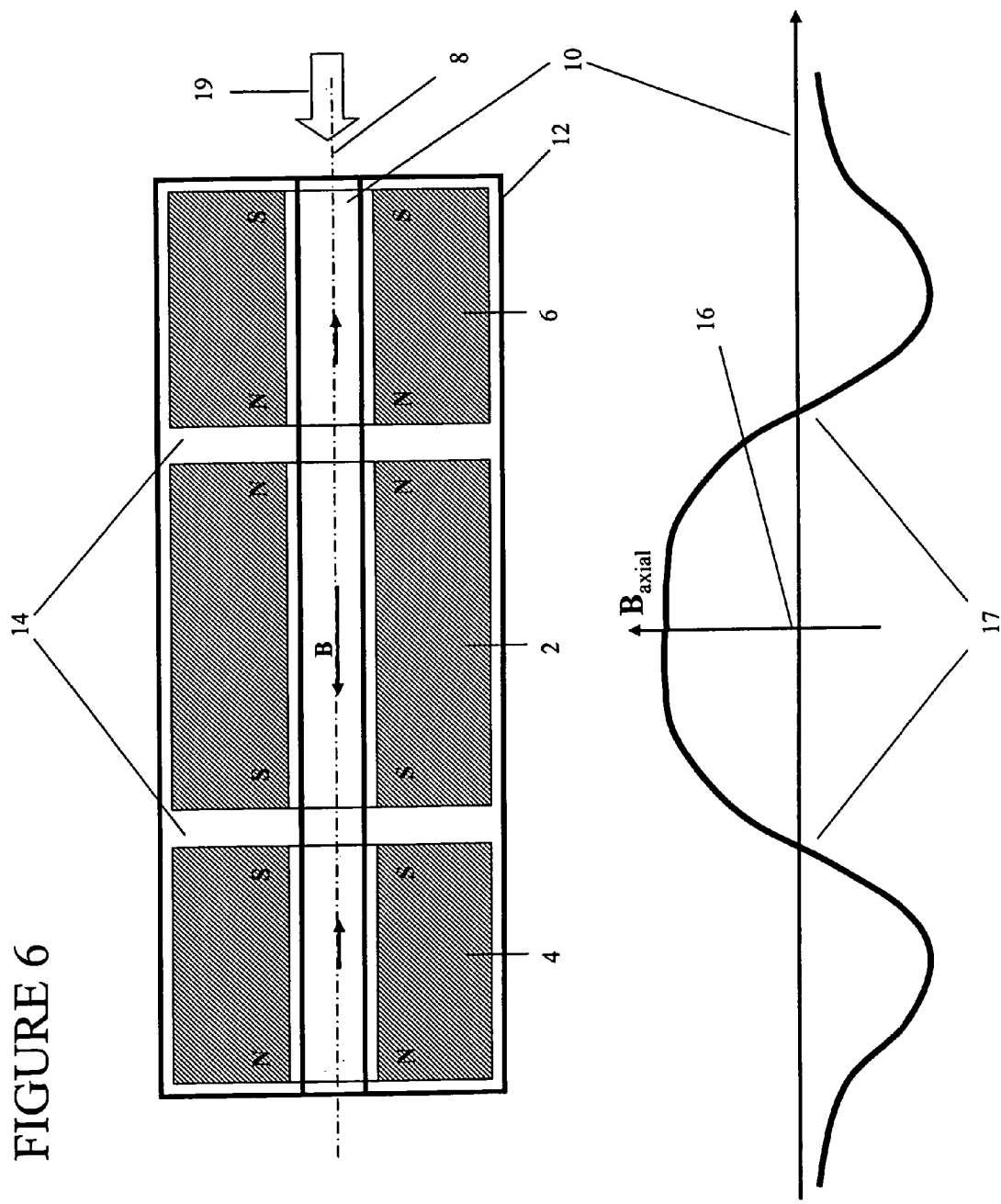
FIG. 6 is a schematic depicting a profile of a magnetic field generated inside the air through-holes of the hollow body flux sources utilized in one permanent magnet structure according to an embodiment of the present invention along the common axis of the through-holes.

In one preferred embodiment of the present invention, the field as shown in FIG. 6 is symmetrical, but this requirement is not necessary for the present invention and other possible arrangements are suitable for the present invention. For example, the second magnet flux source 4 can include a through-hole body, while the third magnet flux source 6 may not have a through-hole body. In that situation, the magnetic field along the common axis will not be symmetrical. Further, different magnetic materials for the second and third sources can be used to produce a magnetic field along the common axis that is not symmetrical.

In general, it is desired that the magnetic dipole field in the place where ions are to be trapped and analyzed will not be reversed. In that region (e.g., the central region of the central hollow source 2), the field will be dipole, homogeneous, and directed axially, with the reversing points locate outside the central region along the common axis.

Any physical device such as vacuum chamber having an FTMS trap for charged particles, any type of particle detectors that require the use of coherent and uniform magnetic field, a probe of NMR and/or EPR detector, a sample subject to MRI imaging, as well as other devices not limited by above examples, can be placed inside the magnet structure of the present invention. As an example a preferred embodiment of the invention wherein a permanent magnet having the Reversible Magnetic Field (RMF) design is used in an FTICR-MS, is shown in FIG. 7.

As shown in FIG. 7, a quadrupole rod and/or ion traps are inserted in the through-hole 10 along the common axis 8. Ions 19 generated in an ion source 22 (which can be, but is not limited to an ESI or atmospheric pressure MALDI source) from sample 21 (which can be either from the liquid chromatography column, or gas-chromatography column, or from other sampling sources) enter the vacuum system 23 and transit a skimmer 24 from which the ions pass through a first quadrupole rod 26 and then a second quadrupole rod 28. The vacuum system 23 consists of a number of sections connected to each other by openings in the section walls referred to as conductance limits and differentially pumped by vacuum pumps 29. Ions travel in the second quadrupole rod 28 along the magnetic field lines in the second flux source 4, and upon exiting the quadrupole rod 28 enter the central flux source 2 where FTMS trap 20 captures the ions. In this illustrative example, when an FTMS trap of charged particles is used as a mass analyzer, the charged particles are injected along the magnetic flux lines into the FTMS trap and, therefore along the common axis 8 of the magnet structure of the present invention. Moreover, particles can be introduced from external sources into the FTMS trap along the common axis 8 by different mechanisms of ion transport such as disclosed in J. A. Olivares, et al., Anal. Chem., 1987, 59, pp. 1230-1232; R. D. Smith, et al., Anal. Chem. 1988, 60, pp. 436-441; H. J. Xu, H. J., et al., Nucl. Instrum. Meth. Phys. Res., 1993, 333, pp. 274-282; U.S. Pat. Nos. 4,328,420; 4,535,235; 4,963,736; 5,572,035; 5,652,427; 6,107,628; 6,111,250; and U.S. patent application No. 20040211897, the entire contents of which are incorporated herein by reference. In FIG. 7 the charged particles (ions) are introduced into the ICR trap using a quadrupole ion guide. The dimensions of the trap are limited by the diameter of the through-holes of the hollow body sources.

Furthermore, other techniques for mass analysis and mass separation, known in the art, are suitable for the present invention. These techniques include but are not limited to for example a mass spectrometer of an ion cyclotron resonance, a mass spectrometer of an ion cyclotron resonance having a Fourier transform to generate mass spectra, a time-of-flight mass spectrometer, a quadrupole mass spectrometer, a radio-frequency ion trap mass spectrometer, and an ion mobility spectrometer, and other known mass spectrometry techniques utilizing homogeneous magnetic fields for mass isolation, fragmentation, separation, and analysis.

As such, the present invention in one embodiment includes a mechanism for trapping charged particles in at least one of a Penning type trap, a linear radio-frequency multipole trap, or a Paul type trap. In one embodiment, the present invention includes a mechanism for focusing charged particles inside at least one of a radio-frequency multipole ion guide and/or an electrostatic ion guide, a mechanism for storing charged particles for a prolonged time with subsequent isolation of at least part of the charged particles, and/or a mechanism for interactions of the charged particles with at least one of a laser beam, a neutral, or charged particle beam, an electron beam, or a background neutral molecule beam, or any combination thereof. In one embodiment, the present invention can include a mechanism for generating interactions between charged particles resulting in subsequent fragmentation of at least part of the charged particles. For example, the electron source 30 located within the magnet structure near the FTMS trap as shown in FIG. 7 can generate low energy (usually less than 1 eV) electrons 31 which interact with ions inside of the FTMS trap 20 to produce ion fragments via ECD mechanism.

The interaction mechanism of the present invention exemplified by the electron source 30 in FIG. 7 thus includes but is not limited to interactions, which result in fragmentation of the ions. Among techniques known in the art for fragmentation are Electron Capture Dissociation (ECD), where due to energy release, for example, ions capturing electrons dissociate, and Electron Transfer Dissociation (ETD) where ions of one polarity interact with the ions of other polarity and, within this interaction mechanism, an electron from negatively charged ion transfers to the positively charged ion and the latter dissociate. Laser and other particle beam interactions are also suitable in the present invention.

In general, the permanent magnet structure of the present invention can generate a homogeneous axial magnetic field with axial access to a central high magnetic field region for application in a variety of spectroscopic applications including but not limited to mass spectrometry (MS), nuclear magnetic resonance (NMR), electron paramagnetic resonance (EPR), and magnetic resonance imaging (MRI) spectroscopies. As such, the magnet structure of the present invention can produce inside the central flux source a unidirectional magnetic field for analyzing at least one of a mass-to-charge ratio of a charge particle, a frequency of orbiting of electrons in an atom, a frequency of an electron spinning, a frequency of spinning of an atomic nucleus, a magnetic moment of an atom or an atomic nucleus, an energy of an electron in an atom.

While the invention has been shown and described with reference to select embodiments thereof, it will be recognized that various changes in form and detail may be made herein without departing from the spirit and scope of the invention as defined by the appended claims. Indeed, the above-described embodiments are illustrative, and numerous additional modifications and variations are possible in light of the above teachings. For example, elements and/or features of different illustrative and exemplary embodiments herein may be combined with each other and/or substituted for each other within the scope of this disclosure and appended claims. It is therefore to be understood that within the scope of the appended claims, the disclosure of this patent specification may be practiced otherwise than as specifically described herein

The invention claimed is:

1. A magnet structure for spectroscopy, comprising:
   a plurality of permanent magnetic flux sources disposed along a common axis, said plurality including,
   a first magnet flux source including a first through-hole body, and
   second and third magnet flux sources located respectively on opposite sides of the first magnet flux source and having a non-magnetic gap material separating at least one of the second and third magnet flux sources from the first magnet flux source, at least one of the second and third magnet flux sources including a side through-hole body;
   magnetic flux within the first magnet flux source oriented to generate a first magnetic field directed along the common axis;
   respective magnetic fluxes within the second and third magnet flux sources to generate second and third magnetic fields; and
   at least one field component of either the second or third magnetic fields along the common axis inside the respective second or third magnet flux sources opposed to a direction of the first magnetic field on said common axis inside the first magnet flux source,
   wherein the second and third magnet flux sources generate said second and third magnetic fields directed at an oblique angle to the common axis.

2. The magnet structure of claim 1, wherein the first through-hole body comprises a through-hole in which the first magnetic field permeates.

3. The magnet structure of claim 2, wherein the through-hole comprises a cylindrical, square, or elliptic through-hole.

4. The magnet structure of claim 1, wherein said at least one field component comprises components of both the second and third magnetic fields generated along the common axis in the area within and between the second and third magnet flux sources, said components of both the second and third magnetic fields opposing the direction of the first magnetic field on said common axis.

5. The magnet structure of claim 1, wherein the plurality of permanent magnetic flux sources are configured to produce a first dipolar magnetic field along the common axis inside the first magnet flux source and to produce second and third dipolar magnetic fields inside respective of the second and third magnet flux sources, and at least one of the second and third dipolar magnetic fields has an opposing polarity to the first dipolar magnetic field.

6. The magnet structure of claim 5, wherein both the second and third dipolar magnetic fields have an opposing polarity to the first dipolar magnetic field.

7. The magnet structure of claim 1, wherein at least one of the second and third magnetic fields permeates the side through-hole body.

8. The magnet structure of claim 1, wherein the side through-hole body comprises a cylindrical, square, or elliptic through-hole.

9. The magnet structure of claim 1, wherein both the second and third magnet flux sources include said side through-hole body.

10. The magnet structure of claim 1, wherein at least one of the plurality of permanent magnetic flux sources comprises:
    a plurality of permanent magnet segments including magnetic materials having a coercivity greater than 500 Oersteds.

11. The magnet structure of claim 1, wherein the second and third magnet flux sources are disposed adjacent to said first flux source.

12. The magnet structure of claim 11, wherein the first magnet flux source is configured to be spaced apart from the second and third magnet flux sources by an adjustable distance permitting magnetic flux adjustment within a through-hole in the first through-hole body.

13. The magnet structure of claim 12, wherein the first magnet flux source is configured to be spaced apart from either one of the second and third magnet flux sources by a distance less than twice a diameter of the through-hole in the first through-hole body.

14. The magnet structure of claim 1, wherein the first, second, and third magnet flux sources comprises at least one of:
    a plurality of permanent magnet segments including magnetic materials made of different permanent magnet alloys having different coercivities;
    a plurality of permanent magnet segments including magnetic materials made of different permanent magnet alloys having the same coercivity;
    a plurality of permanent magnet segments including magnetic materials made of the same permanent magnet alloys having the same coercivity;
    a plurality of permanent magnet segments including magnetic materials made of the same permanent magnet alloys having different coercivities.

15. The magnet structure of claim 1, further comprising:
    a housing for any one of the plurality of permanent magnetic flux sources; and
    an array of permanent magnet segments each having a magnetic field and arranged inside the housing to form any one of said first, second, and third magnetic fields.

16. The magnet structure of claim 15, wherein said array is one of a linear array and a polar array, or a combination of thereof.

17. The magnet structure of claim 15, wherein the housing comprises:
    plural housing units containing respectively magnetic materials of the permanent magnet segments for the first, second, and third magnet flux sources and assembled into separated units.

18. The magnet structure of claim 17, further comprising:
    a spacing mechanism configured to adjust a distance between the plural housing units.

19. The magnet structure of claim 17, wherein the magnetic structure is included in at least one of an ion cyclotron resonance mass spectrometer, a mass spectrometer of an ion cyclotron resonance having a Fourier transform to generate mass spectra, a time-of-flight mass spectrometer, a quadrupole mass spectrometer, a radio-frequency ion trap mass spectrometer, an ion mobility spectrometer, a nuclear magnetic resonance spectrometer, an electron paramagnetic resonance spectrometer, or a magnetic resonance imaging spectrometer.

20. The magnet structure of claim 1, wherein the non-magnetic gap material comprises a part of an adjustable gap whose gap separation is adjustable by a spacing mechanism.

21. The magnet structure of claim 1, wherein the non-magnetic gap material comprises air.

22. An instrument for spectrometry, comprising:
a mass spectrometer configured to analyze a mass of collected ions;
a plurality of permanent magnetic flux sources disposed along a common axis, said plurality including,
a first magnet flux source including a first through-hole body, and
second and third magnet flux sources located respectively on opposite sides of the first magnet flux source and having a non-magnetic gap material separating at least one of the second and third magnet flux sources from the first magnet flux source, at least one of the second and third magnet flux sources including a side through-hole body;
magnetic flux within the first magnet flux source oriented to generate a first magnetic field directed along the common axis;
respective magnetic fluxes within the second and third magnet flux sources to generate second and third magnetic fields; and
at least one field component of either the second or third magnetic fields along the common axis inside the respective second or third magnet flux sources opposed to a direction of the first magnetic field on said common axis inside the first magnet flux source, wherein the second and third magnet flux sources generate said second and third magnetic fields directed at an oblique angle to the common axis.

23. The instrument of claim 22, wherein the first through-hole body comprises a through-hole in which the first magnetic field permeates.

24. The instrument of claim 23, wherein the through-hole comprises a cylindrical, square, or elliptic through-hole.

25. The instrument of claim 22, wherein said at least one field component comprises components of both the second and third magnetic fields generated along the common axis in the area within and between the second and third magnet flux sources, said components of both the second and third magnetic fields opposing the direction of the first magnetic field on said common axis.

26. The instrument of claim 22, wherein the plurality of permanent magnetic flux sources are configured to produce a first dipolar magnetic field along the common axis inside the first magnet flux source and to produce second and third dipolar magnetic fields inside respective of the second and third magnet flux sources, and
at least one of the second and third dipolar magnetic fields has an opposing polarity to the first dipolar magnetic field.

27. The instrument of claim 26, wherein both the second and third dipolar magnetic fields have an opposing polarity to the first dipolar magnetic field.

28. The instrument of claim 22, wherein at least one of the second and third magnetic fields permeates the side through-hole body.

29. The instrument of claim 22, wherein the side through-hole body comprises a cylindrical, square, or elliptic through-hole.

30. The instrument of claim 22, wherein the second and third magnet flux sources are configured to generate said second and third magnetic fields directed at an angle between −90 and +90 degrees to the common axis.

31. The instrument of claim 22, wherein both the second and third magnet flux sources include said side through-hole body.

32. The instrument of claim 22, wherein at least one of the plurality of permanent magnetic flux sources comprises:
a plurality of permanent magnet segments including magnetic materials having a coercivity greater than 500 Oersteds.

33. The instrument of claim 22, wherein the second and third magnet flux sources are disposed adjacent to said first flux source.

34. The instrument of claim 22, wherein the first magnet flux source is configured to be spaced apart from the second and third magnet flux sources by an adjustable distance permitting magnetic flux adjustment within a through-hole in the first through-hole body.

35. The instrument of claim 34, wherein the first magnet flux source is configured to be spaced apart from either one of the second and third magnet flux sources by a distance less than twice a diameter of the through-hole in the first through-hole body.

36. The instrument of claim 22, wherein the first, second, and third magnet flux sources comprises at least one of:
a plurality of permanent magnet segments including magnetic materials made of different permanent magnet alloys having different coercivities;
a plurality of permanent magnet segments including magnetic materials made of different permanent magnet alloys having the same coercivity;
a plurality of permanent magnet segments including magnetic materials made of the same permanent magnet alloys having the same coercivity;
a plurality of permanent magnet segments including magnetic materials made of the same permanent magnet alloys having different coercivities.

37. The instrument of claim 22, further comprising:
a housing for any of the plurality of permanent magnetic flux sources; and
an array of magnetic materials arranged inside the housing to form any one of said first, second, and third magnetic fields.

38. The instrument of claim 37, wherein said array is one of a linear array and a polar array, or a combination of those.

39. The instrument of claim 37, wherein the housing comprises:
plural housing units containing respectively magnetic materials of the permanent magnet segments for the first, second, and third magnet flux sources and assembled into separated units.

40. The instrument of claim 39, further comprising:
a spacing mechanism configured to adjust a distance between the plural housing units.

41. The instrument of claim 22, wherein the mass spectrometer comprises at least one of:
means for trapping charged particles in at least one of a Penning type trap, a linear radio-frequency multipole trap, and a Paul type trap;

means for focusing charged particles inside at least one of a radio-frequency multipole ion guide and an electrostatic ion guide;

means for storing charged particles for prolong time with subsequent isolation of at least part of said charged particles, or for interactions of said charged particles with at least one of introduced laser beams, neutral, or charged particle beams, electron beams, or background neutral molecules, or any combination of said interactions; and means for generating interactions between charged particles resulting in subsequent fragmentation of at least part of said charged particles;

and the magnet structure is a part of at least one of said means for trapping, means for focusing, means for storing, and means for generating.

42. The instrument of claim 22, wherein the mass spectrometer comprises at least one of: a mass spectrometer of an ion cyclotron resonance, a mass spectrometer of an ion cyclotron resonance having a Fourier transform to generate mass spectra, a time-of-flight mass spectrometer, a quadrupole mass spectrometer, a radio-frequency ion trap mass spectrometer, or an ion mobility mass spectrometer.

43. The instrument of claim 22, further comprising:
a particle beam injector configured to inject particles into a central region of the first flux source.

44. The magnet structure of claim 22, wherein the non-magnetic gap material comprises a part of an adjustable gap whose gap separation is adjustable by a spacing mechanism.

45. The magnet structure of claim 22, wherein the non-magnetic gap material comprises air.

46. An instrument for spectroscopy, comprising:
a magnet structure including the following:
a plurality of permanent magnetic flux sources disposed along a common axis, said plurality including,
a first magnet flux source including a first through-hole body, and
second and third magnet flux sources located respectively on opposite sides of the first magnet flux source and having a non-magnetic gap material separating at least one of the second and third magnet flux sources from the first magnet flux source, at least one of the second and third magnet flux sources including a side through-hole body;
magnetic flux within the first flux magnet source oriented to generate a first magnetic field directed along the common axis;
respective magnetic fluxes within the second and third magnet flux sources to generate second and third magnetic fields; and
at least one field component of either the second or third magnetic fields along the common axis inside the respective second or third magnet flux sources opposed to a direction of the first magnetic field on said common axis inside the first magnet flux source;
said magnet structure configured to produce inside the first magnet flux source a unidirectional magnetic field for analyzing at least one of a mass-to-charge ratio of a charge particle, a frequency of orbiting of electrons in an atom, a frequency of an electron spinning, a frequency of spinning of an atomic nucleus, a magnetic moment of an atom or an atomic nucleus, or an energy of an electron in an atom,
wherein the second and third magnet flux sources generate said second and third magnetic fields directed at an oblique angle to the common axis.

47. The magnet structure of claim 46, wherein the non-magnetic gap material comprises a part of an adjustable gap whose gap separation is adjustable by a spacing mechanism.

48. The magnet structure of claim 46, wherein the non-magnetic gap material comprises air.

49. A magnet structure for spectrometry comprising:
a plurality of magnetic flux sources disposed along a common axis including at least one permanent magnet flux source having an interior working volume and having non-magnetic gap materials separating respective ones of the magnetic flux sources;
said plurality of magnetic flux sources generating a resultant magnetic field;
a magnetic field component of the resultant magnetic field along said common axis reverses at least once a direction thereof such that a first magnetic field component along the common axis in the working volume is opposite a second magnetic field component in at least one other point on said common axis,
wherein at least one of the magnetic flux sources generates an oblique magnetic fields directed at an oblique angle to the common axis.

50. The magnet structure of claim 49, wherein the non-magnetic gap material comprises air.

51. The magnet structure of claim 49, wherein the non-magnetic gap material comprises a part of an adjustable gap whose gap separation is adjustable by a spacing mechanism.

* * * * *